United States Patent
Currie et al.

(12)

(10) Patent No.: US 6,267,909 B1
(45) Date of Patent: *Jul. 31, 2001

(54) PLANARIZATION COMPOSITION FOR REMOVING METAL FILMS

(75) Inventors: James E. Currie, Dover Plains, NY (US); Michael Jones, Sunnyvale, CA (US); Thomas J. Grebinski, Boise, ID (US)

(73) Assignee: Advanced Technology & Materials Inc., Danbury, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/416,353

(22) Filed: Oct. 12, 1999

Related U.S. Application Data (63) Continuation of application No. 08/825,769, filed on Apr. 2, 1997, now Pat. No. 5,993,685.

(51) Int. Cl.$^7$ .................. H01L 21/302; C09K 13/00
(52) U.S. Cl. ................ 252/79.1; 252/79.2; 252/79.3
(58) Field of Search ................... 252/79.1, 79.2, 252/79.3

(56) References Cited

U.S. PATENT DOCUMENTS

| | | | |
|---|---|---|---|
| 3,877,183 | * 4/1975 | Deckert et al. ................. | 51/283 |
| 4,842,837 | * 6/1989 | Shimizu et al. ................ | 423/335 |
| 5,230,833 | * 7/1993 | Romberger et al. ............. | 252/363.5 |
| 5,264,010 | * 11/1993 | Brancaleoni et al. ........... | 51/308 |
| 5,614,444 | * 3/1997 | Farkas et al. ................ | 437/225 |
| 5,654,216 | * 8/1997 | Adrian ....................... | 438/627 |
| 5,993,685 | * 11/1999 | Currie et al. ................ | 252/79.1 |

FOREIGN PATENT DOCUMENTS 7-094455   * 4/1995   (JP) .

\* cited by examiner

*Primary Examiner*—Gregory Mills
*Assistant Examiner*—George Goudreau
(74) *Attorney, Agent, or Firm*—D. Benjamin Borson; Oliver A. Zitzmann (57) ABSTRACT

A planarization composition is set forth in accordance with an embodiment of the invention. The composition comprises spherical silica particles having a weight average particle diameter which falls within the range from about $0.03\mu$ to about $2\mu$ and is monodisperse in that at least about 90 weight percent of the particles have a variation in particle diameter from the average particle diameter of no more than about ±20%. A liquid carrier comprising up to 20 weight percent ROH, and an amine hydroxide which is $NR_4OH$ or $NR_2NR_3OH$, where each R is $HCH_3$, $CH_2CH_3$, $C_3H_7$ or $C_4H_9$, in the amount of 0.1 to 10 weight percent; an oxidizer which is in the amount from about 0.5% to 15% weight percent; an acid stabilizer for adjusting the pH to fall within a range from about 7.0 to about 0.5; and the remainder is water. The invention also relates to a thinning, polishing and planarizing apparatus and to a method for carrying out the thinning, polishing and planarizing operation.

5 Claims, 3 Drawing Sheets

PLANARIZATION COMPOSITION FOR REMOVING METAL FILMS

This is a Continuation of U.S. patent application Ser. No. 08/825,769, filed Apr. 2, 1997; now U.S. Pat. No. 5,993,685.

TECHNICAL FIELD

The present invention relates to a planarization composition which is particularly useful for thinning, polishing and planarizing integrated circuitry deposited on semiconductor wafers which have had at least one metal conducting film deposited on their surfaces. The thinning, polishing and planarizing serves to remove the metal film. The invention also relates to a thinning, polishing and planarizing apparatus and to a method for carrying out the thinning, polishing and planarizing operation.

BACKGROUND OF INVENTION

In semiconductor processing, it is common to deposit a hard material, for example a metal or metal nitride such as tungsten, titanium, titanium/tungsten or titanium nitride, with the deposited material filling holes which extend into the body of an insulating thin film and provide an electrical conducting path from the semiconducting or conducting layer under the insulating surface or conductor to a distance above the surface. The deposited material constitutes what is commonly referred to as a via, plug, trench or contact. When this process is carried out, a thin coating of the material being deposited to form the via is also deposited globally on the upper surface of the insulating layer. This deposited metal layer above the insulating layer must be removed prior to carrying out additional operations on the wafer. The removal of layers of this nature is generally carried out by a thinning, polishing and planarizing operation utilizing a hard surface of a polishing pad and a polishing slurry which wets the pad and is frictionally moved against the excess deposited metal surface to be removed. The slurry generally includes alumina particles as the abrasive material along with a liquid chemical carrier and reactant. Basically, the alumina and the chemical carrier are respectively hard and reactive enough so as to abrade away the excess deposited metal which has been deposited on the insulating surface when forming the vias, plugs or contact regions. The result, however, is a thinned and scratched surface and is not uniform (planar) enough to be suitable for the manufacture of more advanced integrated circuits which utilize submicron geometries. Further, the thinning, polishing and planarizing operation is considered too slow because of the titanium layer being too resistant to today's thinning, polishing and planarizing operation.

It is well known to make use of chemical mechanical polishing (CMP). In this process, more rapid thinning, polishing and planarization can occur through utilization of an abrasive material, generally alumina or silica, along with a liquid carrier and a compound which is corrosive or oxidative toward or will dissolve the substrate. For example, U.S. Pat. No. 5,391,258 of Brancaleoni, et al. discusses such a process for enhancing the polishing rate of silicon, silica or silicon-containing articles including composites of metals and silica. The composition includes an oxidizing agent along with an anion which suppresses the rate of removal of the relatively soft silica thin film. The suppressing anion may be any of a number of carboxylic acids. Alumina is used as the abrasive material.

It is also known to utilize another abrasive material, specifically silica of very small size, to polish substrates such as rough cut silicon wafers prior to beginning their processing into integrated circuit devices. As an example, Shimizu, et al., in U.S. Pat. No. 4,842,837, teaches a process for producing fine spherical silica having a particle size of $0.5\mu$ and less. The resulting colloidal silica is used as a polish for semiconductor wafers, specifically silicon wafers. The particles are mono-disperse whereby polishing of the relatively soft silicon wafers surface can be carried out to produce a substantially flat wafer surface. Such particles, by themselves and without the aids of chemical action, are not, however, abrasive enough to be used to effectively polish off the above mentioned materials such as tungsten, titanium or titanium nitride. Indeed, such colloidal silica, which has a pH above 7, and in the absence of an oxidizing agent, is not capable of effectively, i.e., at an acceptably great rate, thinning and planarizing metal or metal nitrides. Furthermore, because the pH is above 7, the exposed silica would be preferentially etched while the metal and metal nitride layers, relatively speaking, remain un-thinned and un-planarized. Substantial and undesirable dishing of the silicon dioxide would occur around the metal and metal nitride plugs, vias, etc. To be an effective thinning and planarizing CMP slurry for metals and metal nitrides, it is essential that the metal and metal nitride be thinned and planarized at a rate substantially higher than the exposed silicon oxides.

PCT Application WO 95/24054, published Sep. 8, 1995, shows that oxidizing agents such as hydrogen peroxide can be added to polishing slurries when the slurries contain an ion for limiting the rate of removal of silicon and silicates as set forth in U.S. Pat. No. 5,391,258 discussed immediately above. Other oxidizers are also mentioned. In particular, potassium iodate and sodium iodate are disclosed as being oxidizing agent useful in such polishing slurries. As with U.S. Pat. No. 5,391,258 the abrasive agent utilized is alumina.

U.S. Pat. No. 5,376,222 discloses the use of colloidal silica in an alkaline solution for polishing a silica film on a semiconductor. The polishing solution includes a cation of an alkali metal, an alkaline earth, or an ammonium ion. The preferred composition includes sodium or potassium ion. The slurry is not used to remove metals but only silica.

U.S. Pat. No. 3,877,183 discloses the use of precipitated silicates and/or silicofluorides as polishing substances for semiconductor materials. These polishing substances are utilized to polish the semiconductor, namely, silicon.

A very real problem exists with respect to polishing materials such as metals and metal nitrides and silicon dioxide insulating layers so as to remove them at sufficient rates and selectivities. In particular, when holes are made into insulating layers, for example into doped silicon dioxide layers, and then metals are deposited in those holes to provide conducting metal vias from one level of a semiconductor device to another, the resulting excess metal conducting film on the exposed doped oxide surface of the wafer must be polished away, thinned and planarized without appreciably thinning and planarizing the newly exposed doped or undoped silicon dioxide. It is desirable to stop the thinning and planarizing process once the excess metals and metal nitride have been polished away thus exposing the underlying doped silicon dioxide layer. Ideally, all of the exposed surfaces of the metal, metal nitride and doped silicon dioxide should be perfectly planar. However, the most advanced abrasive and liquid chemical CMP slurries of the prior art are becoming less effective as integrated circuit manufacturers strive for reduced scratch density, improved surface roughness, greater throughput, improved selectivity, and improved post-CMP surface cleanliness.

At the start of a typical prior art thinning and planarizing (CMP) process, one metal layer is exposed. After a substantial amount of thinning and planarization, a second metal nitride layer, a third metal layer and a silicon dioxide layer are exposed to the thinning and planarizing process. With the conventional alumina-based thinning and planarizing process, which includes, intermixed with the alumina abrasive, an acidic liquid system and an oxidizer, each exposed metal and metal nitride thins and planarizes at a different rate. For instance, the most widely used slurry system thins and planarizes the second exposed metal, the titanium so-called "glue" layer, at a substantially different rate than other exposed metal (tungsten) and metal nitride (titanium nitride) layers. The result is a less planar surface than is desired by the integrated circuit device manufacturer. Further, as the polishing process continues to the titanium layer, the polishing process "stops", or slows down, to a polishing rate ⅙ the rate prior to this metal layer. To date, there has not been a satisfactory solution to this problem.

Today's conventional alumina-based CMP slurries have a particle size distribution exceeding +/−300 percent. The higher the particle size distribution, the greater the haze, surface roughness and scratches. Integrated circuit manufacturers are finding today that they must reduce particle size distribution because of a future requirement that they use photolithography technology having a shallower depth of focus. Having a requirement for a shallower depth of focus in the future also requires that the surface of the integrated circuit, as it is being manufactured, have less haze, improved surface roughness and less scratches. Any one of the above parameters, if not improved, can cause an integrated circuit to fail. To date, there has been a substantial effort to reduce the particle size distribution and therefore reduce haze, improve surface roughness and reduce scratch density but without the substantial success required to meet tomorrow's performance requirements (depth of focus) dictated by photolithography.

Furthermore, because of the net positive charge of alumina abrasive particles, when suspended in the liquid chemical, they attach to and therefore "stick" to the newly exposed, negatively charged, doped silica surface thus requiring extensive buff polishing, and mechanical and chemical cleaning procedures to remove alumina slurry remnants that, if not removed, can cause circuitry failure. Accordingly it would be highly desirable, if possible, to develop a polishing composition and polishing method which is easier to clean from the surface after the thinning and planarizing process.

Because of the above shortcomings of today's conventional alumina-based thinning and planarizing CMP slurry, the industry has been looking for an improved thinning and planarizing system which leads to improved planarity, improved thinning and planarizing rate, improved surface haze, roughness and surface scratch density and, finally, an improved CMP composition that leads to increased surface cleanliness after the thinning and planarizing process.

The present invention is directed to overcoming one or more of the problems as set forth above.

DISCLOSURE OF INVENTION

A planarization composition is set forth in accordance with an embodiment of the invention. The composition comprises spherical silica particles having a silica particle concentration of 0.5 to 30 weight percent, a weight average particle diameter which falls within the range from about $0.03\mu$ to about $2\mu$, and is mono-disperse in that at least about 90 weight percent of the particles have a variation in particle diameter from the average particle diameter of no more than about ±20%. A liquid carrier comprising up to 20 weight percent alcohol, and an amine hydroxide which is $NR_4OH$ or $NR_2NR_3OH$, where each R is any one of H, $HCH_3$, $CH_2CH_3$, $C_3H_7$ or $C_4H_9$, in the amount of 0.1 to 10 weight percent; an oxidizer which is in the amount from about 0.5 to 15 weight percent; an acid stabilizer for adjusting the pH to fall within a range from about 7.0 to about 0.5; and the remainder is water.

A secondary planarization composition is set forth in accordance with an embodiment of the invention. The composition comprises spherical silica particles having a silica particle concentration of 0.5 to 15 weight percent, a weight average particle diameter which falls within the range from about 0.03 micron to about 2 micron, and is mono-disperse in that at least about 90 weight percent of the particles have a variation in particle diameter from the average particle diameter of no more than about +/−15%. A liquid carrier comprising up to 45 weight percent alcohol, and an amine hydroxide which is $NR_4OH$ or $NR_2NR_3OH$, where each R is any one of H, $HCH_3$, $CH_2CH_3$, $C_3H_7$ or $C_4H_9$, in the amount of 0.1 to 10 weight percent and the rest is water.

In accordance with another embodiment of the present invention, a pad which is wet with the above planarization composition is set forth.

Yet another embodiment of the invention is a method of planarizing a substrate having a hard metal, metal nitride or insulating surface coating to remove the coating. The method comprises positioning the planarization composition set forth above between a pad and the surface coating and rubbing the pad against the surface coating until the surface coating has been removed.

In accordance with a particularly preferred embodiment of the invention, the materials utilized are all of ultra-pure quality whereby the suspension has a total metals content of no more than about 3,000 parts per billion by weight.

Yet another embodiment of the invention is a method for manufacturing inter-dielectric and inter-metal layer vias and plugs. An insulating layer thin film is deposited onto a surface of a substrate. One or more small holes defined by respective sidewalls and bottoms are etched into the film and extend to at least the substrate surface. A first metal thin film is introduced onto the insulating thin film top surface and onto the respective sidewalls and bottoms to coat the insulating layer thin film and respective sidewalls and bottoms formed, without filling the holes, thereby forming a first metal surface. A first metal nitride thin film is deposited onto the first metal surface in such a manner that it coats the holes and forms a first metal nitride surface. A second metal film is deposited onto the first metal nitride surface in such a manner that it fills the holes and forms a second metal surface. A planarizing composition as set forth above is positioned between the second metal surface and a pad. The pad is rubbed against the second metal surface sufficiently to thin and planarize the first metal thin film, the first metal nitride thin film, and the second metal film.

By making use of amminated, acid-stabilized silica particles which are spherical and monodisperse (of a uniform size and within a specific and limited size range), along with an oxidizer which is useful for oxidizing the hard materials which are to be removed by converting them into materials which can be removed by the relatively soft and uniform silica particles, the ability has been gained to very controllably polish hard materials and to end up with a resultant polished surface which is highly planar. When an oxidizer is also present, as it preferably is, it serves to accelerate the removability of the oxidized compound resulting from reaction of the hard material with the oxidizers. The results obtained have been thinning and planarization rates over twice the conventional rates, one-half the surface roughness levels, substantially reduced wafer non-uniformity, one-tenth the scratch density and a substantial reduction of the post-CMP particle and residue levels encountered after thinning with the conventional alumina-based slurry.

Operating in accordance with the invention, such common via materials as titanium, titanium/tungsten, titanium nitride and tungsten, as well as insulative silicon dioxide, can be removed at controlled rates to provide a planar surface of improved planarity.

BRIEF DESCRIPTION OF THE DRAWINGS

The invention will be better understood by reference to the figures of the drawings wherein like numbers denote like parts throughout and wherein.

BEST MODE FOR CARRYING OUT INVENTION

Figure 1:
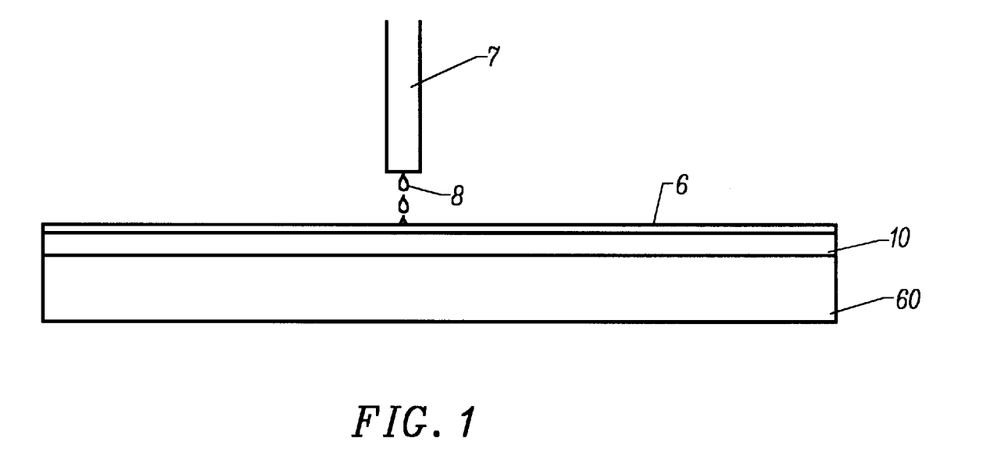
FIG. 1 illustrates a schematic view of a pad being wet by the planarization composition of the present invention.

FIG. 1 illustrates a schematic view of a pad 10 being wet with the planarization composition 8 of the present invention. The planarization composition 8 forms a planarization composition thin film 6 on the top surface of the pad 10 to thereby wet the pad 10. A delivery system 7 brings the planarization composition 8 above the pad 10 which is located on a surface of the polishing platen 60. Another method of wetting the pad 10 includes a holed platen (not shown) having holes (not shown) from the top surface of the platen to the bottom surface of the platen. The planarization composition 8 would then be introduced from the bottom surface of the pad 10 through the bottom surface of the holed platen (not shown) to form a uniform planarization composition thin film. It is understood that either method to wet the pad 10 may be used, or any other method that results in a pad 10 with a uniform planarization composition thin film.

Figure 2:
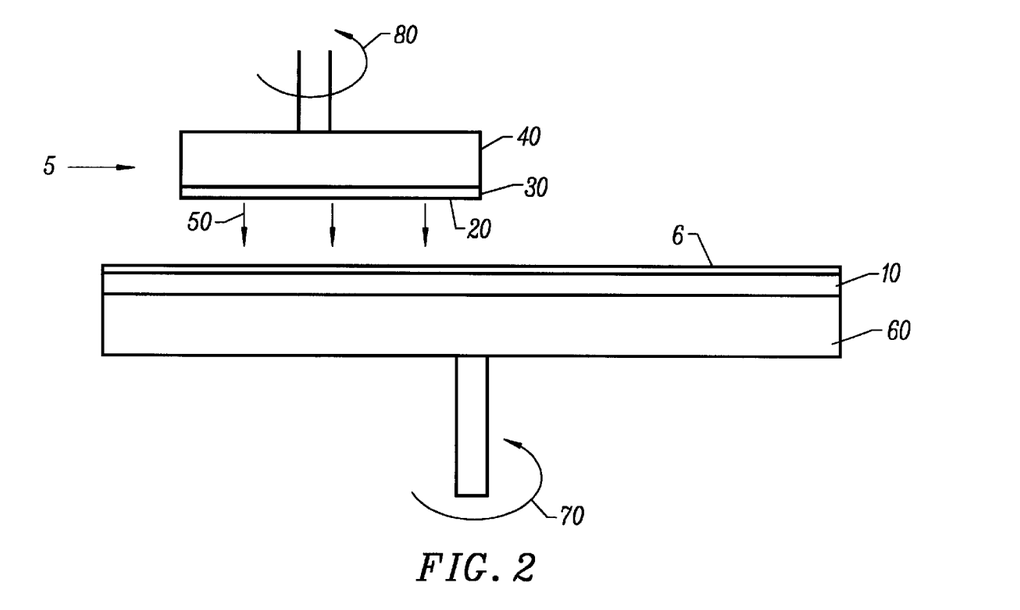
FIG. 2 illustrates a pad, wet by the planarization composition in accordance with the present invention, in position to thin, polish and planarize a hard flat surface layer from a partially fabricated integrated circuit.

FIG. 2 illustrates a schematic view of the pad 10 in accordance with an embodiment of the present invention wet by the planarization composition (not shown) to form the planarization film 6. A quill 40, rotating in a wafer rotating direction 80, holds wafer 30 in the pre-rubbing position 5 to lower the quill 40 and wafer 30 in the rubbing direction 50 towards the pad 10. The pad 10 is supported by polishing platen 60 and rotates in a pad rotating direction 70. The pad 10 is used to thin, polish and planarize the hard flat surface layer 20 of a partially fabricated integrated circuit (not shown) on wafer 30.

Figure 3:
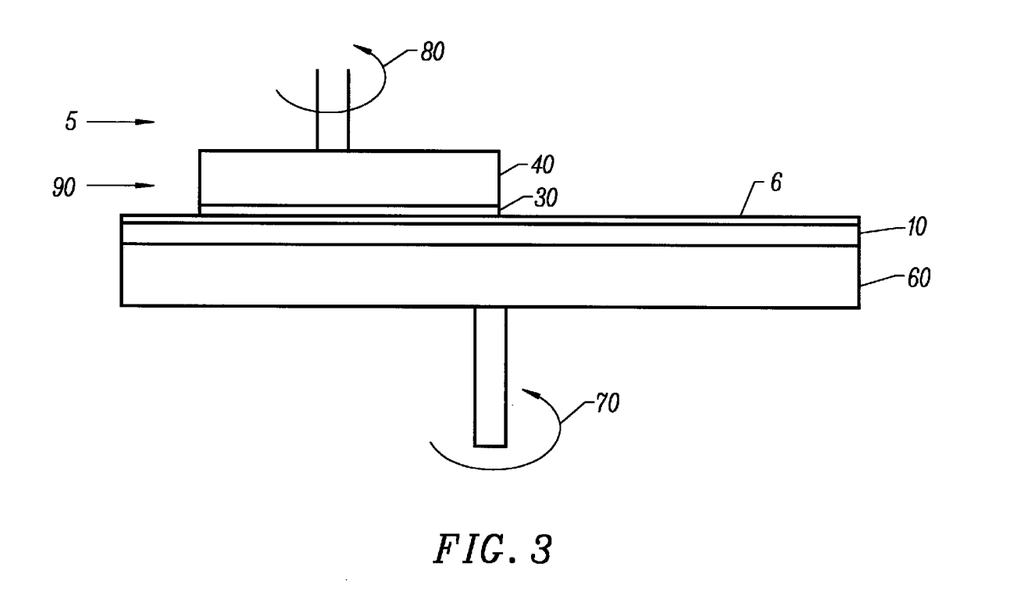
FIG. 3 illustrates the method of planarizing a substrate of the present invention by rubbing of the pad of FIGS. 1 and 2 across the hard flat surface layer of FIG. 2 for providing the desired thinning, polishing and planarizing.

FIG. 3 illustrates a rubbing position 90 of the quill 40 and wafer 30 downwardly relative to the pre-rubbing position 5 of FIG. 2. In this rubbing position 90, the pad 10 wet with the planarization composition to form the planarization composition thin film 6 rubs against the hard flat surface layer 20 of the wafer 30 to provide the desired thinning, polishing and planarizing of the hard flat surface layer 20. The pad 10 has been wet by a planarization composition with a composition as follows:

In accordance with the present invention, a planarization composition is set forth which comprises from about 0.5 to about 30 weight percent of spherical, mono-dispersed silica particles. The particles have a weight average particle diameter which falls within the range from about $0.03\mu$ to about $2\mu$. More preferably, the weight average particle diameter falls within the range from about $0.02\mu$ to about $0.4\mu$. The particles are mono-disperse, that is, at least about 90 weight percent of the particles have a variation in particle diameter from the weight average particle diameter of no more than about ±20%, preferably less than ±15%. This is a critical requirement of the particles. The spherical silica particles in accordance with the present invention can be made in the manner discussed and set forth in previous mentioned U.S. Pat. No. 4,842,837, the disclosure which is hereby incorporated by reference. The composition further comprises a liquid carrier comprising up to 20 weight percent alcohol, and an amine hydroxide which is $NR_4OH$ or $NR_2NR_3OH$, where each R is any one of H, $HCH_3$, $CH_2CH_3$, $C_3H_7$ or $C_4H_9$, in the amount of 0.1 to 10 weight percent; an oxidizer which is in the amount from about 0.5 to 15 weight percent; an acid stabilizer for adjusting the pH to fall within a range from about 7.0 to about 0.5; and the remainder is water.

Figure 4:
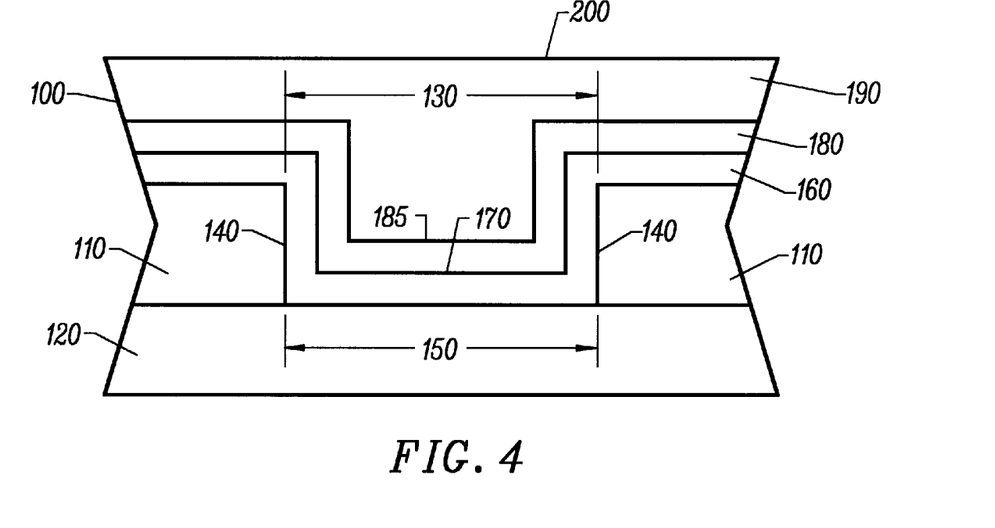
FIG. 4 is a cross-sectional view illustrating a sample semiconductor device manufactured using the method for manufacturing inter-dielectric and inter-metal layer vias and plugs of the present invention before the thinning, polishing and planarizing operation.

FIG. 4 illustrates an embodiment of the present invention depicting a cross-sectional view of a sample semiconductor device 100 made using the method for manufacturing an inter-dielectric and inter-metal layer vias and plugs of the present invention. An insulating layer thin film 110 on substrate 120 has been etched to form a hole 130 formed by sidewalls 140 and bottom 150. Etching is performed using any one of many conventional methods. It is understood that while FIG. 4 depicts a single hole 130 for a sample semiconductor device 100, the present invention extends to more than one sample semiconductor device and may have numerous holes. The insulating film 110 is generally a doped or undoped silicon dioxide but may be a polyamide, Teflon, boron nitride, spin-on-glass (SOG), FSG, or N-Parylene. A first metal thin film 160 is deposited on top of the insulating layer thin film 110 and along sidewalls 140 and bottom 150. The first metal thin film 160 merely coats the insulating film 110 and hole 130, sidewalls 140 and bottom 150, rather than filling the entire hole 130. The first metal thin film 160 is preferably titanium, while tungsten or any other metal of similar properties may also be used. The first metal thin film 160 forms a first metal surface 170.

On top of the first metal surface 170 is a first-metal nitride thin film 180 that coats the first metal surface 170 and forms a first metal nitride surface 185. A second metal film 190 is then placed on top of the first metal nitride surface 185. The second metal film 190 may be either titanium or tungsten or any other metal having similar properties to these two metals. While the first metal thin film 160 and first metal nitride thin film merely coat the respective surface below each, the second metal film 190 fills the hole 130 and forms a second metal surface 200. It should be understood that while the present embodiment describes a sample semiconductor device 100 with a first metal thin film 160, a first metal nitride film 180 and a second metal film 190, there may be variations in the number of films that still fall within the present invention as claimed below, for example, there may be instances where it is deemed that the first metal 160 is not necessary.

Figure 5:
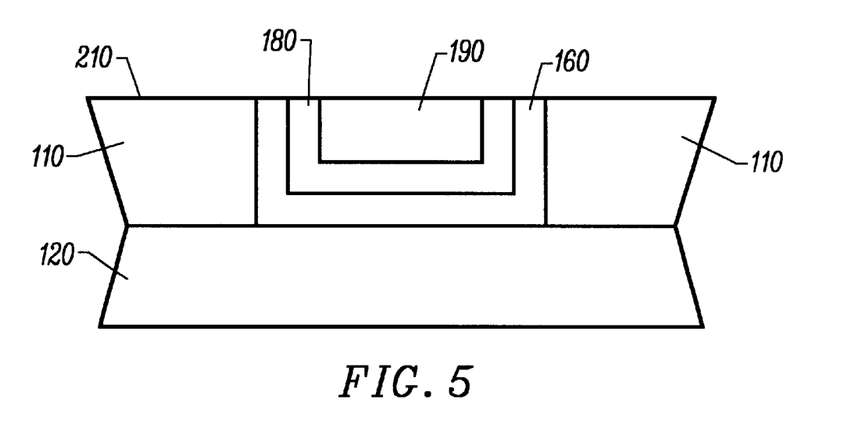
FIG. 5 illustrates a cross-sectional view of the sample semiconductor device of FIG. 4 following a thinning, polishing and planarizing operation to remove the metal films and further illustrates the vias formed into the wafer being processed.

In use, it is desirable to remove by polishing, thinning and planarizing the first metal thin film 160, the first metal nitride thin film 180 and the second metal film 190 to expose only the underlying insulating layer thin film 110 (generally doped silicon dioxide) as shown in FIG. 5. Ideally, all the exposed surfaces of the first metal thin film 160, the first metal nitride film 180 and the second metal film 190 would be perfectly planar at 210. Planarizing is accomplished by positioning the planarization composition described above between the pad 10 against a solid surface coating of the wafer 20 of FIG. 2. In this embodiment, the solid surface coating would include the second metal thin film 190, the first metal nitride thin film 180 and the first metal thin film 160 of FIG. 4, with the second metal surface 200 contacting the pad 10 wet with the aforementioned composition. The pad 10 is rubbed against the second metal surface 200 due to the rotating of the wafer 20 and the pad 10 and the perfectly planar surface 210 of FIG. 5 is accomplished.

A secondary planarization process, known as "buff polish", is sometimes necessary after the method of planarizing described above is completed. The secondary planarization process is used when the roughness of the resultant insulating layer thin film 110 of FIG. 5 is not satisfactory or if it is necessary to remove strongly held slurry composition remnants. Certain factors, such as the use of ferric nitrate as an oxidizer in the planarization process above, causes the surface of the exposed insulating thin layer 110 to be too rough and therefore the secondary planarization is needed. The roughness (variance is surface coating) of the insulating film 110 should be less than about 10 angstroms, otherwise the secondary planarization process is needed. It should be understood that a secondary planarization process may be needed when additional factors, other than using a ferric nitrate oxidizer in the planarization composition above (see Example 1 below), causes the surface roughness of the insulating layer thin film 110 to be too rough, i.e. greater than 10 angstroms.

The secondary planarization process uses a secondary planarization composition comprising spherical silica particles having a silica particle concentration of 0.5 to 15 weight percent, a weight average particle diameter which falls within the range from about 0.03 micron to about 2 micron, and is mono-dispersed in that at least about 90 weight percent of the particles have a variation in particle diameter from the average particle diameter of no more than about +/−15%. A liquid carrier comprising up to 45 weight percent alcohol, and an amine hydroxide which is $NR_4OH$ or $NR_2NR_3OH$, where each R is any one of H, $HCH_3$, $CH_2CH_3$, $C_3H_7$ or $C_4H_9$, in the amount of 0.1 to 10 weight percent and the rest is water.

The specific method of formulating the silica particles which is currently preferred is to add tetraethylorthosilicate (TEOS) to an ammonium hydroxide solution in water having a pH of approximately 9.0–12.0. The products formed by the reaction include the silica particles of the desired size, ammonia, ammonium ions and ethanol. What results is a suspension of spherical silica particles in an ethanol/ammonium hydroxide solution.

The reaction can be varied somewhat. For example, the TEOS can be replaced with a tetraalkylorthosilicate when the alkyl group comprises methyl, propyl or butyl radicals. If this is done the product is not ethanol but instead the corresponding alcohol. Furthermore, the ammonium hydroxide can be replaced by compounds of the formulas $NR_4OH$, and/or $NR_2N_3OH$ where each R is any one of $CH_3$, $CH_2CH_3$, $C_3H_7$ or $C_4H_9$. The amine hydroxide constituent of the nature defined above will usually be present in the amount from about 0.1% to about 10% weight percent.

Generally, the alcohol constituent will comprise up to about 20% of the resulting planarization composition, all percents herein being by weight.

Any of a number of oxidizers can be included with the liquid carrier. Particularly desirable are such oxidizers as hydrogen peroxide, potassium iodate, ferric nitrate, ferric cyanide, sodium iodate, and peroxyacetic acid. The oxidizer is generally present in an amount from about 0.5% to about 15%, more preferably from about 3% to about 13%. The remainder of the composition is water. The total amount of water will not exceed about 70%.

In accordance with the present invention, the pH is adjusted to fall within a range from about 0.5 to about 7, more preferably about 0.5 to about 6. The pH is preferably adjusted such that the rate of removal of the oxide formed due to the oxidation reaction between the oxidizer and the metal and metal nitride surface coatings are adjusted to a desired substantially equivalent rate. By a desired equivalent rate is meant a rate such that the coating can be removed in a relatively short time and at a rate substantially equivalent for each metal and metal nitride being removed. Generally, it is preferred that the amount of the oxidizer and the pH are selected such that surface polishing rate of the following materials, which are often used for forming vias, are as follows:

Tungsten, 2000 Å to 6,000 Å per minute;
Titanium Nitride, 2000 Å to 6,000 Å per minute;
and Titanium, 2000 Å to 6,000 Å per minute.
Doped and undoped oxides 50–200 Å per minute.

Suitably, the pH adjustment will be such as to adjust the pH to be in the acidic range generally in the range from below 7 to about 0.5, preferably from about 4 to about 1. This will provide the necessary acidity. It is not desirable to make the composition too acidic as the vias may then be attacked and the oxidation rate may be too fast.

Suitable acids which may be used to adjust the pH include inter alia, nitric, sulfuric, hydrochloric, acetic, carboxylic acetic, acetylsalicylic, carboxylic, dicarboxilic acids, and citric acids. There is a concurrent reduction in the amine hydroxide content as the acid is added to the slurry as the amine hydroxide content is reduced as production of a dissolved amine salt of the added acids is increased. The chemistry involved is shown by the following mechanism:

---

I. Hydrolysis of TEOS

The ammonium hydroxide has five components:
$H_2O$, $H_3O^+$, $OH^-$ $NH_3$ (aq), $NH_4^+$
These are at least two mechanisms for the hydrolysis of TEOS:
$(EtO)_4Si + 4H_2O \rightarrow Si(OH)_4 + 4EtOH$,
followed by
$Si(OH)_4 \rightarrow SiO_2 + 2H_2O$,
and

I. Hydrolysis of TEOS $(EtO)_4Si + 4OH^- \rightarrow Si(OH)_4 + 4EtO^-$
followed by
$EtO^- + NH_4^+$ (or $H_3O^+$) $\rightarrow$ EtOH + $NH_3$ (or $H_2O$),
and
$Si(OH)_4 \rightarrow SiO_2 + 2H_2O$
At this point, the components in the system are:
$H_2O$, $H_3O^+$, $OH^-$
$NH_3$ (aq), $NH_4^+$,
EtOH,
$SiO_2$, $(EtO)_4Si$ II. Addition of Carboxylic Acid The addition of a carboxylic acid, $RCO_2H$, adds the following additional components:

$RCO_2H$, $RCO_2^-$,
$EtOH_2^+$

III. Addition of Hydrogen Peroxide

The hydrogen peroxide will react with $NH_3$ (aq) to produce
$NH_2-NH_2$, $NH_2-NH_3^+$,
$NH_2-OH$, $NH_2-OH_2^+$,
$N_2$
It will react with EtOH to produce
$CH_3CHO$,
$CH_3CO_2H$, $CH_3CO_2^-$
In addition acid-base reactions will generate
$H_3O_2^+$, $HO_2^-$.

IV. Addition of Nitrate Ion

The addition of the nitrate ion can add the following:

$NO_3^-$, $N_2O_4$, $HNO_2$, $NO_2^-$, NO, $H_2N_2O_2$, $N_2O$.
In addition the following nitrogen species can be formed from the oxidation of $NH_3$:
$NH_2NH_2$, $NH_2NH_3^+$, $NH_2OH$, $NH_3^+OH$, $N_2$.
Also, there will be the following oxidation products of EtOH:
$CH_3CHO$, $CH_3CO_2H$, $CH_3CO_2^-$ V. Summary of Components $H_2O$, $H_3O^+$, $OH^-$,
$NH_3$(aq), $NH_4^+$, $NH_2NH_2$, $NH_2NH_3^+$,
$NH_2OH$, $NH_2OH_2^+$, $N_2$, $NH_3^+OH$,
$NO_3^-$, $N_2O_4$, $HNO_2$, $NO_2^-$, NO, $H_2N_2O_2$, $N_2O$,
$CH_3CH_2OH$, $CH_3CH_2OH_2^+$, $CH_3CHO$, $CH_2CO_2H$, $CH_3CO_2^-$,
$RCO_2H$, $RCO_2^-$,
$H_2O_2$, $H_3O_2^+$, $HO_2^-$,
$SiO_2$, $(EtO)_4Si$,
$NO_3^-$, $N_2O_4$, $HNO_2$, $NO_2^-$, NO, $H_2N_2O_2$, $N_2O$,
$Fe^{3+}$(aq), $Fe^{2+}$(aq), $Fe(H_2O)_x^{3+}$, $Fe(H_2O)_y^{2+}$,
$Fe(NH_3)_x^{3+}$, $Fe(NH_3)_y^{2+}$, $Fe(RCO_2^-)_x^{3-x}$, $Fe(RCO_2^-)_y^{2-y}$, VI. Addition of potassium iodate With the addition of potassium iodate the following additional species may be present:

$K^+$, $IO_3^-$, HIO, $IO^-$, $I_2$, $I^-$, $I_3^-$.

VII. Summary of Components $H_2O$, $H_3O^+$, $OH^-$,
$NH_3$(aq), $NH_4^+$, $NH_2NH_2$, $NH_2NH_3^+$,
$NH_2OH$, $N_2$, $NH_3^+OH$,
$NO_3^-$, $N_2O_4$, $HNO_2$, $NO_2^-$, NO, $H_2N_2O_2$, $N_2O$,
$CH_3CH_2OH$, $CH_3CH_2OH_2^+$, $CH_3CHO$, $CH_2CO_2H$, $CH_3CO_2^-$,
$RCO_2H$, $RCO_2^-$,
$SiO_2$, $(EtO)_4Si$,
$K^+$, $IO_3^-$, HIO, $IO^-$, $I_2$, $I^-$, $I_3^-$.

The temperature for the thinning, polishing and planarizing operation will generally fall within a non-critical range from about 20° C. to about 80° C. Indeed, the operation is generally initially at about 20–50° C. but the temperature of the surface and the liquid carrier goes up as friction takes place.

In accordance with a particularly preferred embodiment of the invention, the materials utilized are all of ultrapure quality whereby the suspension has a total metals content of no more than about 3,000 parts per billion by weight. This is particularly useful in the semiconductor processing industries since even small amounts of metal can cause errors in devices thereby cutting down on throughput.

The invention will be better understood by reference to the following illustrative experimental examples which demonstrate some of the compositions and advantages of the invention.

EXAMPLE 1

A planarization composition is formed using an ethyl silicate slurry having a content by weight percent of the following components:

| Component | Weight % |
| --- | --- |
| Ammonium hydroxide | 9.0 |
| ETOH | 42.0 |
| $SiO_2$ | 12.0 |

The pH of the ethyl silicate slurry was approximately 12.0 and the particle size was 188 nm +/−13.5%. Ferric Nitrate and nitric acid are added to the ethyl silicate slurry in a volumetric ration of 4:1:4. The resultant planarizing composition set forth above is placed between a pad and the surface coating having the following composition:

| Surface coatings | Thickness (A) |
| --- | --- |
| Tungsten | 6,000 |
| Titanium | 500 |
| Titanium Nitride | 500 |
| Oxide | 13,000 |

The polishing pad was a Thomas West TWI C-22 pad. The example comprises positioning the planarizing composition set forth above between a pad and the surface coating and rubbing the pad against the surface coating according to the following planarizing parameters:

| Parameter | |
| --- | --- |
| Downward Force | 7 psi |
| Back Pressure | 0 psi |
| Table Speed | 120 rpm |

-continued

| Parameter | |
|---|---|
| Quill Speed | 80 rpm |
| Planarizing Time | 70 seconds |

Within a 120 second planarizing period, all surface coatings totaling 7,000 angstroms were cleared to the underlying LPCVD oxide. The measured planarization rate was calculated to be 5,823 angstroms per minute. The tungsten, titanium nitride and titanium filled holes extending into the body of the LPCVD oxide were planar with the LPCVD oxide surface. The selectivity of the tungsten/titanium nitride/titanium surface coating during the planarization process was measured to be 1:1:1.

A secondary planarization process was implemented after the first planarization process. The second planarization process is typically called a "buff polish." A second planarization composition was used which consisted of the same ethyl silicate slurry and ultra-high purity (UHP D.I.) water at a volumetric ration of 1:4, respectively.

A secondary planarization composition is set forth in accordance with an embodiment of the invention. The composition comprises spherical silica particles having a silica particle concentration of 0.5 to 15 weight percent, a weight average particle diameter which falls within the range from about 0.03 micron to about 2 micron, and is mono-disperse in that at least about 90 weight percent of the particles have a variation in particle diameter from the average particle diameter of no more than about +/−15%. A liquid carrier comprising up to 45 weight percent ROH, and an amine hydroxide which is $NR_4OH$ or $NR_2NR_3OH$, where each R is any one of H, $HCH_3$, $CH_2CH_3$, $C_3H_7$ or $C_4H_9$, in the amount of 0.1 to 10 weight percent and the rest is water.

The buff polish comprises positioning the second planarizing composition set forth above between a pad and the surface coating and rubbing the pad against the surface coating according to the following planarizing parameters:

| Parameter | |
|---|---|
| Downward Force | 7 psi |
| Back Pressure | 0 psi |
| Table Speed | 120 rpm |
| Table Temperature | 50° C. |
| Quill Speed | 80 rpm |
| Planarizing Time | 30 seconds |

The buff polish smooths the oxide surface without planarizing further the planarized tungsten/titanium nitride/titanium holes. The oxide surface roughness improves from 20–30 angstroms Root-Mean-Square ("RMS") to less than ten angstroms. The same Thomas West TWI-C22 pad was used for the buff polish. The planarizing equipment used was a Strasbaugh 6EC single head polisher.

EXAMPLE 2

A planarization composition is formed using an ethyl silicate slurry having a content by weight percent of the following components:

| Component | Weight % |
|---|---|
| Ammonium hydroxide | 8.5% |
| ETOH | 47.1% |
| $SiO_2$ | 11.8% |

The pH of the ethyl silicate slurry was approximately 12.1 and the particle size was 323+/−20.0%. Hydrogen Peroxide and Acetic Acid are added to the ethyl silicate slurry in a volumetric ration of 2:1:1. The resultant planarizing composition set forth above between a pad and the surface coating having the following composition:

| Surface Coatings | Thickness |
|---|---|
| Tungsten | 6,000 |
| Titanium | 500 |
| Titanium Nitride | 500 |
| Oxide | 13,000 |

The polishing pad was a Rodel Suba-500 pad. The example comprises positioning the planarizing composition set forth above between a pad and the surface coating and rubbing the pad against the surface coating according to the following planarizing parameters:

| Parameter | |
|---|---|
| Downward Force | 9 psi |
| Back Presure | 0 psi |
| Table Speed | 120 rpm |
| Quill Speed | 120 rpm |
| Planarizing Time | 175 seconds |

Within a 120 second planarizing period, all surface coatings totaling 7,000 angstroms were cleared to the underlying LPCVD oxide. The measured planarizing rate was calculated to be 2,430 angstroms per minute. The within wafer nonuniformity was +/−3.5%. The tungsten, titanium nitride and titanium filled holes extending into the body of the LPCVD oxide were planar with the LPCVD oxide surface. The selectivity of the tungsten/titanium nitride/titanium surface coating during the planarization process was measured to be 1:1:1.

A secondary planarization process was not necessary as was in Example 1 because the oxide surface roughness after the primary planarization process was less than 6.0 angstroms RMS.

EXAMPLE 3

A planarization composition is formed using an ethyl silicate slurry having a content by weight percent f the following components:

| Component | Weight % |
|---|---|
| Ammonium hydroxide | 9.0 |
| ETOH | 42.0 |
| $SiO_2$ | 13.1 |

The pH of the ethyl silicate slurry was approximately 12.1 and the particle size was 188+/−13.5%. Hydrogen Peroxide and Acetic Acid are added to the ethyl silicate slurry in a volumetric ratio of 1:1:1. The resultant planarizing composition set forth above was between a pad and the surface coating having the following composition:

| Surface Coatings | Thickness |
| --- | --- |
| Tungsten | 6,000 |
| Titanium | 500 |
| Titanium Nitride | 500 |
| Oxide | 13,000 |

The polishing pad was a Rodel IC1000-2A pad. The example comprises positioning the planarizing composition set forth above between a pad and the surface coating and rubbing the pad against the surface coating according to the following planarizing parameters:

| Parameter | |
| --- | --- |
| Downward Force | 7 psi |
| Back Pressure | 0 psi |
| Table Speed | 120 rpm |
| Quill Speed | 80 rpm |
| Planarizing Time | 120 seconds |

The measured planarization rate was calculated to be 3,469 angstroms per minute. The within wafer on uniformity was 1.0%. The selectivity of the tungsten/titanium nitride/titanium surface coating during the planarization process was measured to be 1:1:1.

A secondary planarization process was not necessary as was in Example 1 because the oxide surface roughness after the primary planarization process was less than 8 angstroms RMS.

EXAMPLE 4

Ethyl silicate slurry having a content by weight percent of the following components:

| Component | Weight % |
| --- | --- |
| Ammonium hydroxide | 6.0 |
| ETOH | 38.0 |
| SiO$_2$ | 13.0 |

The pH of the ethyl silicate slurry was approximately 11.5 and the particle size was 188 nm+/−13.5%. Ferric Nitrate and nitric acid are added to the ethyl silicate slurry in a volumetric ratio of 4:1:4. The resultant planarizing composition set forth above is placed between a pad and the surface coating having the following composition:

| Surface coatings | Thickness (A) |
| --- | --- |
| Tungsten | 6,000 |
| Titanium nitride | 500 |
| Oxide | 13,000 |

In this example there was not a titanium layer present. The polishing pad was a Thomas West TWI C-22 pad. The example comprises positioning the planarizing composition set forth above between a pad and the surface coating and rubbing the pad against the surface coating according to the following planarizing parameters:

| Parameter | |
| --- | --- |
| Downward Force | 7 psi |
| Back pressure | 0 psi |
| Table Speed | 120 rpm |
| Quill speed | 80 rpm |
| Planarizing time | 70 seconds |

Within a 120 second planarizing period, all surface coatings totaling 7,000 angstroms were cleared to the underlying LPCVD oxide. The measured planarization rate was calculated to be 5,823 angstroms per minute. The tungsten, titanium nitride and titanium filled holes extending into the body of the LPCVD oxide were planar with the LPCVD oxide surface. The selectivity of the tungsten/titanium nitride/titanium surface coating during the planarization process was measured to be 1:1:1.

A secondary planarization process was implemented after the first planarization process. The second planarization process is typically called a "buff polish". A second planarization composition was used which consisted of the same ethyl silicate slurry and UHP D.I. water at a volumetric ratio of 1:4 respectively.

The secondary planarization composition is set forth in accordance with an embodiment of the invention. The composition comprises spherical silica particles having a silica particle concentration of 0.5 to 15 eight percent, a weight average particle diameter which falls within the range from about 0.03 micron to about 2 micron, and is mono-disperse in that at least about 90 weight percent of the particles have a variation in particle diameter from the average particle diameter of no more than about +/−15%. A liquid carrier comprising up to 45 weight percent alcohol, and an amine hydroxide which is NR$_4$OH or NR$_2$NR$_3$OH, where each R is any one of H, HCH$_3$, CH$_2$CH$_3$, C$_3$H$_7$ or C$_4$H$_9$, in the amount of 0.1 to 10 weight percent and the rest is water.

The buff polish comprises positioning the second planarizing composition set forth above between a pad and the surface coating and rubbing the pad against the surface coating according to the following planarizing parameters:

| Parameter | |
| --- | --- |
| Downward force | 7 psi |
| Back pressure | 0 psi |
| Table speed | 120 rpm |
| Table temperature | 50° C. |
| Quill speed | 80 rpm |
| Planarizing time | 60 seconds |

The buff polish smoothes the oxide surface without planarizing further the planarized tungsten/titanium nitride/titanium holes. The oxide surface roughness improves from 20–30 angstroms RMS to less than seven angstroms. The same Thomas West TWI-C22 pad was used for the buff polish. The planarizing equipment used was a Strasbaugh 6EC single head polisher.

INDUSTRIAL APPLICABILITY

The present invention provides a composition, article of manufacture and method for carrying out CMP operations to remove such materials as titanium, titanium nitride and tungsten from the surfaces of semiconductor wafers following the deposition of such materials into holes to form vias, contacts and plugs from one level of the semiconductor device to another. Advantageously, the method of the present invention provides a much more uniformly planarized surface than can be obtained by prior art methods. This is extremely important to the semiconductor industry wherein extreme precision on a nanometer scale is essential.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

We claim:

1. A composition, comprising:

between about 0.5 to about 30 wt. % of spherical silica particles having a weight average particle diameter which falls within a range of between about $0.03\mu$ and about $2\mu$, and is mono-disperse in that at least about 90 wt. % of the particles have a variation in particle diameter from the weight average particle diameter of no more than about ±20%; and a liquid carrier comprising the following components in about the weight percent ranges specified:

alcohol, up to about 45;

an amine hydroxide selected from the group consisting of $NR_4OH$ and $NR_2NR_3OH$, wherein each R is any one of H, $CH_3$, $CH_2CH_3$, $C_3H_7$, or $C_4H_9$, about 0.1 to about 10; and the remainder water.

2. The composition of claim 1, wherein said composition comprises said components and reaction products thereof.

3. A planarization composition, comprising:

between about 0.5 and about 30 wt. % of spherical silica particles having a weight average particle diameter which falls within a range of between about $0.03\mu$ and about $2\mu$, and is mono-disperse in that at least about 90 wt. % of the particles have a variation in particle diameter from the weight average particle diameter of no more than about ±20%; and a liquid carrier comprising an alcohol, an amine hydroxide and water.

4. The composition of claim 3, wherein said amine hydroxide is selected from the group consisting of $NR_4OH$ and $NR_2NR_3OH$, wherein each R is any one of H, $CH_3$, $CH_2CH_3$, $C_3H_7$, or $C_4H_9$.

5. The composition of claim 1, wherein said composition is a planarization composition.

* * * * *